United States Patent [19]

Stopper

[11] Patent Number: 4,467,400
[45] Date of Patent: Aug. 21, 1984

[54] WAFER SCALE INTEGRATED CIRCUIT

[75] Inventor: Herbert Stopper, Orchard Lake, Mich.

[73] Assignee: Burroughs Corporation, Detroit, Mich.

[21] Appl. No.: 378,023

[22] Filed: May 13, 1982

Related U.S. Application Data

[62] Division of Ser. No. 225,580, Jan. 16, 1981.

[51] Int. Cl.³ .......................................... H05K 01/18
[52] U.S. Cl. .................................. 361/403; 174/68.5; 357/45; 361/406; 361/409
[58] Field of Search ............... 361/410, 416, 403, 406, 361/409; 357/2, 45; 174/68.5

[56] References Cited

U.S. PATENT DOCUMENTS

| | | | |
|---|---|---|---|
| 3,312,871 | 4/1967 | Seki et al. | 361/410 X |
| 3,445,823 | 5/1969 | Petersen | 365/163 X |
| 3,558,992 | 1/1971 | Huener et al. | 317/101 |
| 3,726,002 | 4/1973 | Greenstein et al. | 174/68.5 X |
| 3,777,221 | 12/1973 | Tatsuko | 361/416 |
| 3,803,483 | 4/1974 | McMahon | 325/51 |
| 3,981,070 | 9/1976 | Buelow et al. | 29/574 |
| 4,234,888 | 11/1980 | Calhoun | 357/45 |
| 4,295,182 | 10/1981 | Aubusson et al. | 324/73 R X |
| 4,364,044 | 12/1982 | Kusano | 361/416 X |

Primary Examiner—R. R. Kucia
Attorney, Agent, or Firm—Charles J. Fassbender; Lynn L. Augspurger; Kevin R. Peterson

[57] ABSTRACT

Disclosed is a substrate for an array of integrated circuit dice 10' disposed in a regular array on the monolithic wafer substrate 1. Also disposed on the wafer substrate 1 is a network 11' interconnecting various circuits 10', with other integrated circuits, disposed in the array formed on the wafer for data transfer therebetween. Terminals 12' exist in the network 11' for connection of the connections of the network with the various integrated circuits 10'. The networks are connected to a contact pad by one or more connection pads 13', for power and for data entry, and there is provided an auxiliary lead and contact pad for each network for testing each network for operability, also disclosed in the testing method.

15 Claims, 14 Drawing Figures

FIG.1.C
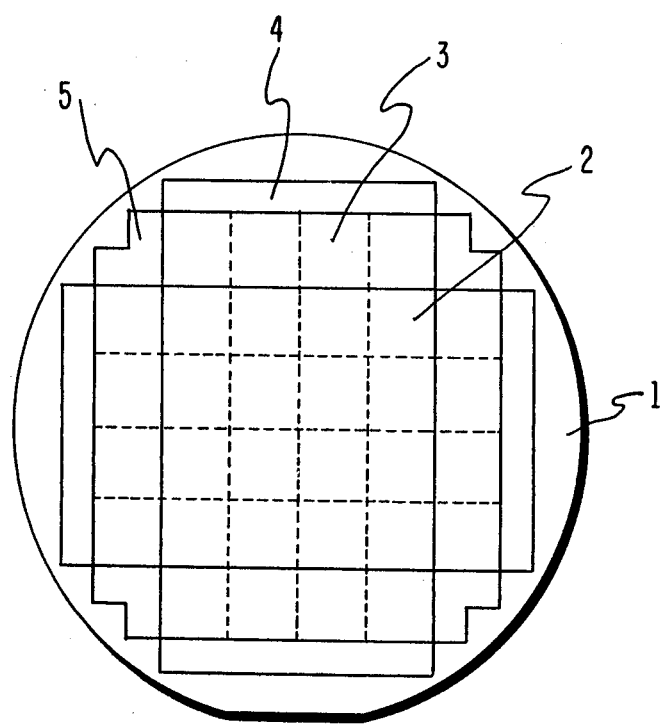

WAFER SCALE INTEGRATED CIRCUIT

This is a division of application Ser. No. 225,580, filed Jan. 16, 1981.

BACKGROUND OF THE INVENTION

1. Field of the Invention

This invention relates to the fabrication and testing of monolithic integrated circuit wafers. More particularly, this invention relates to the addition to state-of-the-art wafers of a new conductive test circuit integrated on the wafer during manufacture which may be used to test the networks between the dice on the wafer so they may be tested to prove that the wafer meets quality standards. In addition, the method of testing this new wafer is disclosed.

2. Description of the Prior Art

While no satisfactory method has heretofore been developed which meets the need for testing networks on wafers, there have been developed ways of testing the integrated circuit dice themselves, as may be seen from U.S. Pat. No. 4,183,460 granted Jan. 15, 1980, and the reference shown therein, which disclosure is incorporated herein by reference. This patent is deemed illustrative of the state of the art. It is also well known to use testing networks on printed circuit boards on which each die, after testing and packaging, is inserted.

Current state-of-the-art tests on monolithic integrated circuit wafers are performed by automatic testers which sequence across the wafer, die to die, to identify each workable die, before the wafer is scribed. If the dice is defective, a mark is made over each defective die, and it is discarded. Such commercially available machines include those manufactured by various corporations which manufacture the chips, or they can be obtained commercially as fully automatic wafer probe systems from Pacific Western Systems, Inc., 505 E. Evelyn, Mt. View, CA 94041 or Electro-Glas, Inc., 2901 Coronado Dr., Santa Clara, CA 95051. In addition, probe equipment can be obtained from Kulicke Soffa Industry, Inc., 507 Prudential Rd., Horsham, PA 19044, which probe equipment interfaces with commercially available I. C. Test Equipment such as made by Fairchild, Teradyne, etc.

In addition, printed circuit board testers exist which insert pin probes at a plurality of points on the printed circuit boards, which pins are sequenced to determine whether the networks, now defined by the packaged circuits placed in the board and soldered or otherwise bonded in place, have a proper connection. In this art, it is known to place small fixed resistors in a circuit so that tests being made can measure whether the circuit has a known resistance.

However, it has become possible to build full scale wafers now because the yield of good dice on the wafer has increased. A number of theoretical advantages arise from what may be called wafer scale integration. In order to achieve faster switching speeds, or conversely, smaller signal propagation times, it has been recognized that the die which contains the integrated circuits could be connected on the wafer itself. This requires a network being formed on the wafer by masking or by electron beam pattern generation. This can make use of the space between dice, or the whole wafer as a network. In this latter instance, the individual die from another wafer is directly bonded to the network of the wafer containing the network. In the former case, the ultimate wafer scale integration is achieved, for the entire wafer can be utilized for its best tested function.

The problem with machines constructed on wafer scale is effective testing of the circuits so constructed. It is to this problem that the invention which I have described below is directed.

SUMMARY OF THE INVENTION

According to my invention, I have provided a monolithic integrated circuit wafer on which may be disposed thereon an array of integrated circuit dice and interconnection networks for interconnection of a plurality of dice to one another and to an external connection pad for the wafer. To this known device I have, in accordance with my invention, provided that the network is composed of a plurality of subnetworks, each having a terminal connection. The terminal connection is connected to an external connection test pad for the wafer.

Each of the terminal connections is of measured distance to the external connection test pad and has an inherent measurable resistance. This measurable resistance is a function of the length of the connection to the external connection test pad.

According to my invention, after having provided the aforesaid novel structure for a wafer network, one is able to test the network for fault by means of resistance testing of the premeasured subnetworks.

Accordingly I have provided a substrate in the form of a wafer made of silicon or any other material suitable for integrated circuit-type processing. Two layers of interconnection separated by a layer of insulation are deposited and patterned on this wafer. The resolution for paterning the metal on the wafer is such that the two layers of metal provide enough routing channels to interconnect all the chips which can physically be placed on the wafer. The actual routing is provided by a particular pattern of orthogonal lines with a special selection of cross-points connecting certain lines to each other in such a manner that all possibly desired connections among substrate bonding pads and between substrate bonding pads and the outside world can be made.

I will describe herein below a representative simplified preferred embodiment, and the method of testing the wafer. Thereinafter, I will describe alternate embodiments which may be preferred in specific instances.

DESCRIPTION OF THE INVENTION

FIG. 1C shows an improved wafer in accordance with my preferred master wafer in plan view, of which layers will be shown.

Figure 1A:
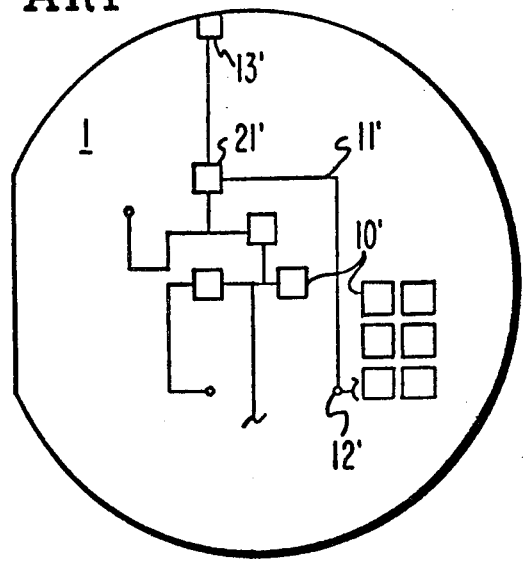
FIG. 1A shows the wafer of the Prior Art.

Turning to the drawings in more detail, it will be seen from FIG. 1A representing prior art wafers that, as previously stated, they may be formed with an array of integrated circuit dice 10' disposed in a regular array on the monolithic wafer 1. Also disposed on the wafer 1 is a network 11' interconnecting various circuits 10', shown as a die, with other integrated circuits, such as die 21', disposed in the array formed on the wafer for data transfer therebetween.

Terminals or nodes 12' exist in the network 11' for connection of the connections of the network with the various integrated circuits 10'. The networks are connected via a lead to one or more contact pads 13', for power and for data entry.

Figure 1B:
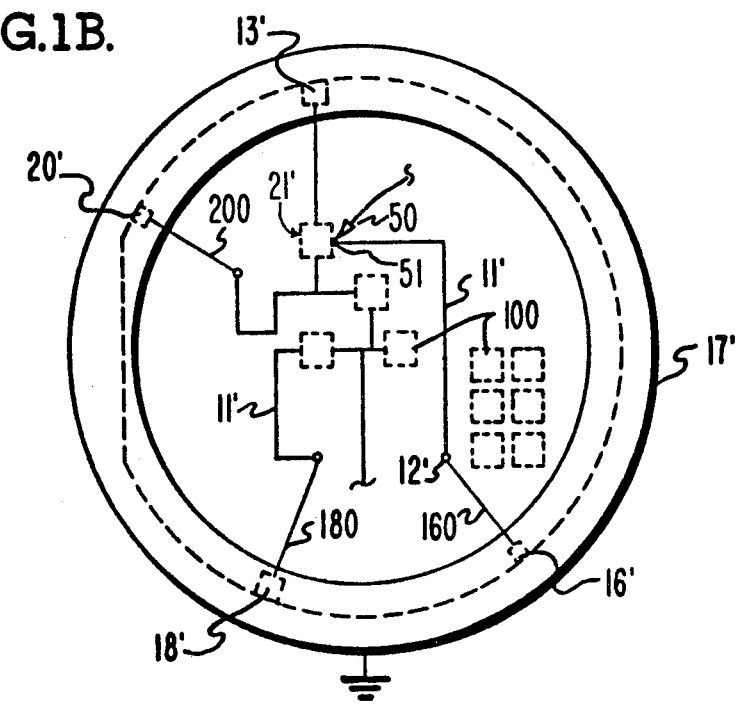
FIG. 1B shows an improved wafer in accordance with the preferred simple embodiment of my invention.

My invention as shown in FIG. 1B departs from this Prior Art by the provision of a connection of measured distance to an auxiliary lead 160, 180, 200 and associated pad 16', 18', 20' for each network which is to be tested. This test lead 160 is connected to test pad 16' and to a terminal 12' of the network 11'. The test connection in the form of auxiliary leads 160, 180, 200 and their pads is formed on the wafer, as by diffusion, during the process of manufacture of the wafer and the integrated circuits disposed thereon. Preferably, the test connection is formed by a line approximately ten (10) microns in width and of the same thickness as the other lines of the network, approximately one (1) micron in thickness. It should be here noted that since the usual wafer has a diameter of about 15 centimeters, a line across this diameter would pass a signal in a propagation time of less than one nanosecond.

Since the distance between the test pad 16' and the terminal node 51 of the die position 21' of the network is a known distance for those wafers made with the same mask, the resistance of the net 11' with test connection line is also known, within an acceptable variance. For instance, a line of these dimensions, should it extend all the way across the wafer would have approximately an inherent resistance of 100 ohms, and a connection which is two thirds of the diameter would be approximately 66 ohms. In practice, the accepted parameters of any predetermined line can be measured electrically, by calculation from a test of a known wafer. Thereafter, it will be possible to test all like wafers against this standard to determine whether there is an acceptable network.

Testing of the wafer, now can be accomplished with a known wafer tested, using the method which I would outline herein.

Utilizing a node 51 of the die position 21' to which probe 50 point contact can be made to the network and the pad 16' as an example, the inherent resistance from node 51 to test pad 16' can be measured. The testing node 51 can be grounded at 16' by a grounding device, preferably a conductive elastomeric ring 17' which is connected to ground. It will be noted the elastomeric gasket grounds all terminal pads.

If a normal 50 ohm resistance of the point against ground is to be expected and the normal 50 ohm resistance is found to be present, or within an acceptable variance, the network is proved.

However, if there is a very high resistance, then an open circuit within the network is shown.

If only a 20 ohm resistance is found, then it knows that there is a short to another network on the wafer.

The wafer can be completely tested by utilizing existing probes which previously have been utilized to test each die on the wafer. The same point which will be probed by the probe point on the die will be the position of the network test node 51. Each network has suitable test pads 16', 18', 20'. The elastomeric conductor ring interconnects all test pads to ground. By stepping from one die position to another, a test can be made of the entire wafer.

Now, in my preferred embodiment, as shown in FIG. 1B I bond dice to the network wafer as at die position 100 after the network wafer itself has been tested. This is accomplished by known bonding techniques (gold bump, solder ball, etc.), the type of bond being immaterial. The important point is that an already tested die is bonded to its proper position in an already tested network wafer. The resultant wafer is a hybrid circuit.

FIG. 1C is a plan view of a wafer 1 showing how the available area may be divided up into innercells 2, outer cells 3, logic line hookup areas 4, and power hookup areas 5.

Figure 2:
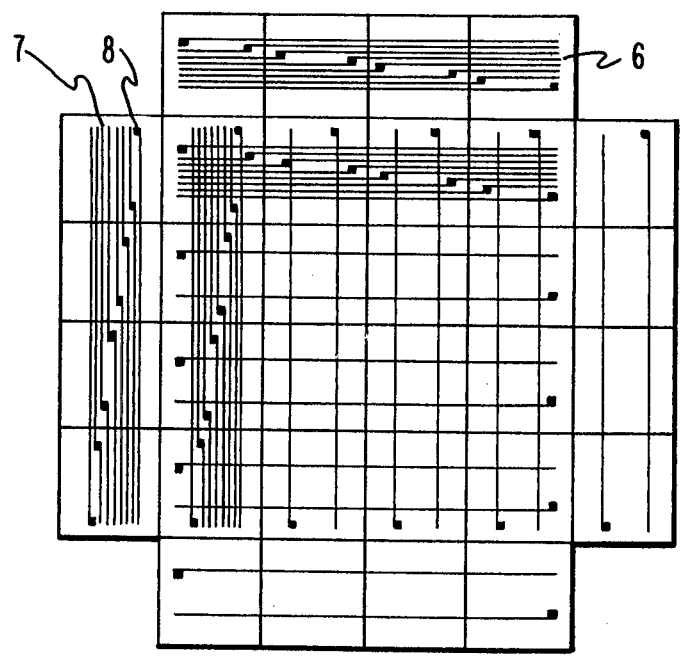
FIG. 2 is a plan view of the layer portions of the wafer of FIG. 1C, showing pad lines.

FIG. 2 shows horizontal pad lines 6 and vertical pad lines 7 crossing a number of cells in such a way that each pad 8 can be connected to its own pad line. Outer cells are crossed by either horizontal or vertical pad lines. Inner cells are crossed by both horizontal and vertical pad lines.

Figure 3:
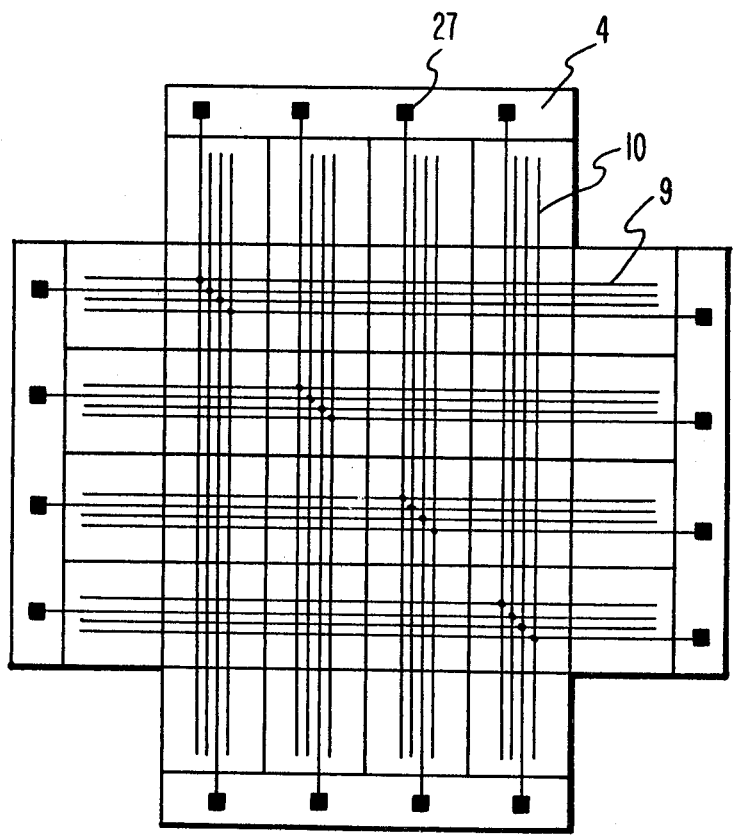
FIG. 3 is a plan view of the layer portion of the wafer of FIG. 1C showing net lines.

FIG. 3 shows horizontal net lines 9 and vertical net lines 10 which cross all cells in such a way that each horizontal pad line 6 is crossed by each vertical net line 10 and each vertical pad line 7 by each horizontal net line 9. Each horizontal net line 9 is connected permanently to exactly one vertical net line 10 and to exactly one contact pad 27 in one of the hookup areas 4. Thus, all pad lines cross all nets and all nets can be externally accessed.

Figure 4:
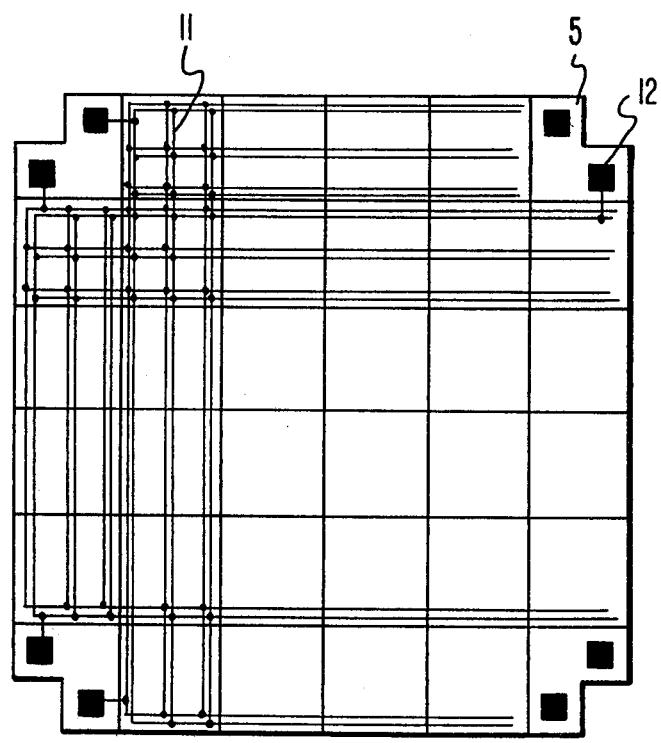
FIG. 4 shows the layer portion of FIG. 1C for power distribution.
Figure 5:
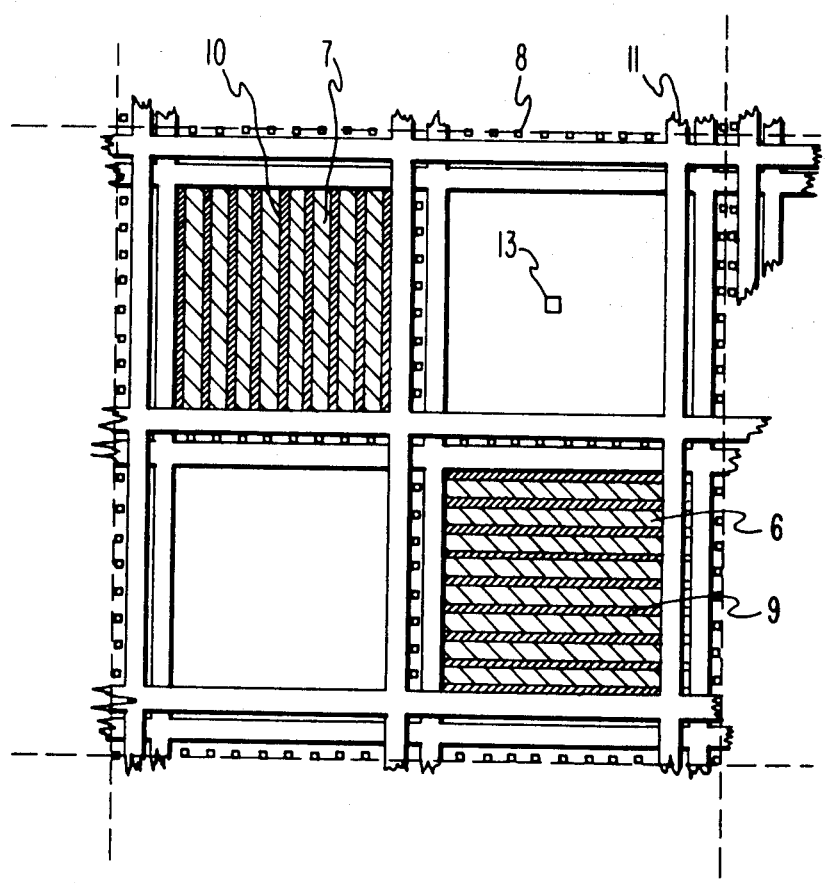
FIG. 5 shows a cell (2 in FIG. 1C) in more detail.

FIG. 4 shows a power grid 11 for a two rail power distribution system. Each cell is crossed by both rails three times, in both the horizontal and vertical directions. The power rails are connected to a pair of contact pads 12 in each power hookup area 5. FIG. 5 shows an inner cell with some more detail. Power grid 11, bonding pads 8, pad lines 6 & 7, and net lines 9 & 10 share the available space in such a way that only two metal planes are needed and that no wires are found under a bonding pad.

Figure 6:
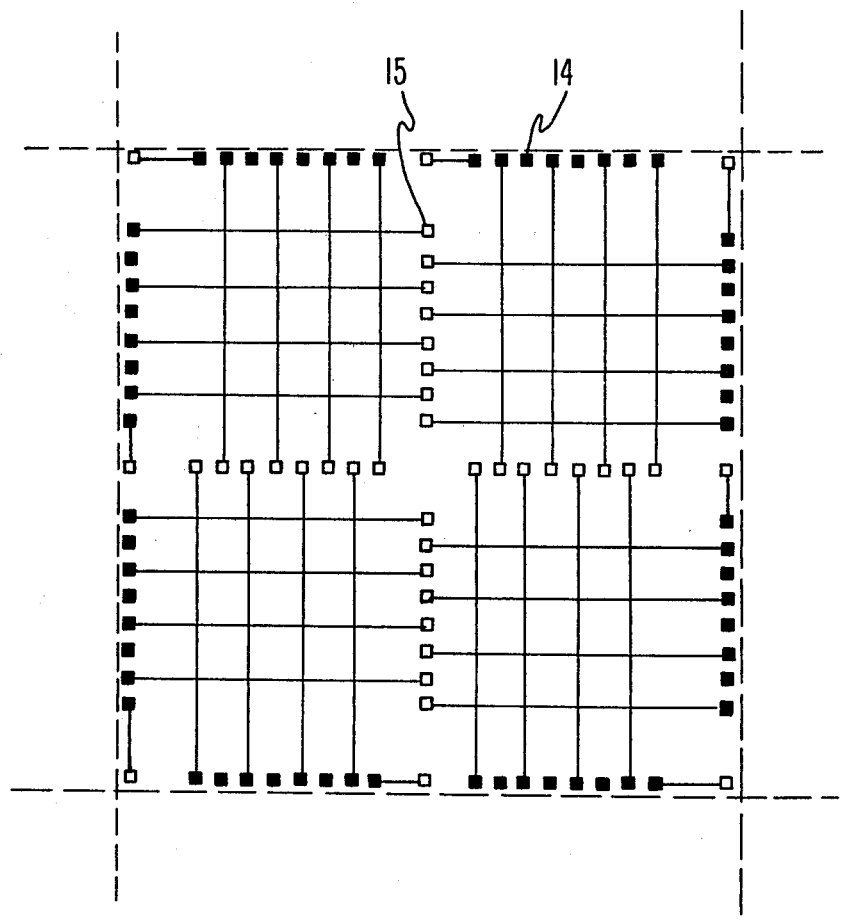
FIG. 6 shows a layer of the cell of FIG. 5 showing bonding pads in detail.

FIG. 6 shows that a cell contains main bonding pads 14 and auxiliary bonding pads 15. Only main pads command their own pad lines are shown in FIG. 2. An auxiliary pad is connected to a next neighbor main pad.

Figure 7:
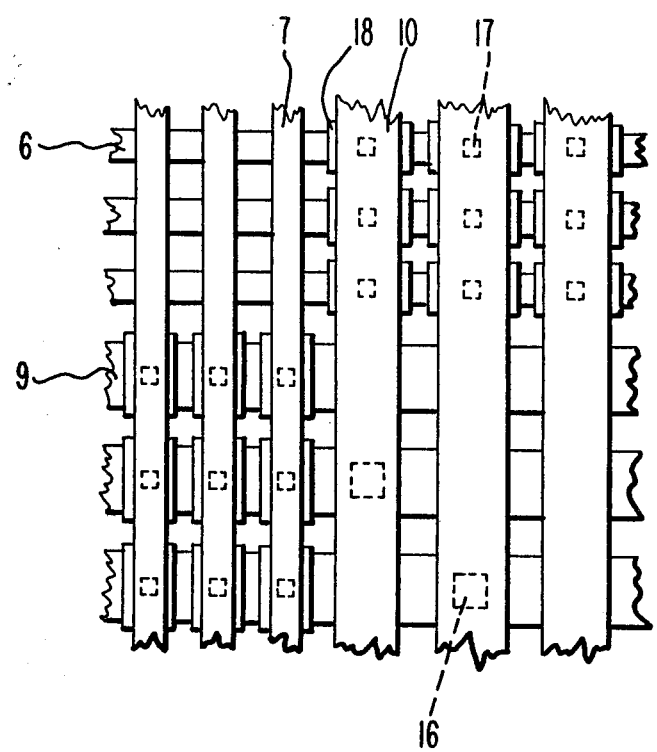
FIG. 7 is a further detail of FIG. 5.

FIG. 7 shows a detail 13 as it may be found in FIG. 5. The narrow lines are pad lines 6 and 7, and the wide lines are net lines 9 and 10. Cross-overs between pad lines are insulated. Cross-overs between net lines are generally also insulated except that each horizontal net line is connected through a via hole 16 at one point to a vertical net line. Cross-overs between pad lines and net lines have a via hole 17 cut into the insulator between the metal layers for a connection in between.

Figure 8:
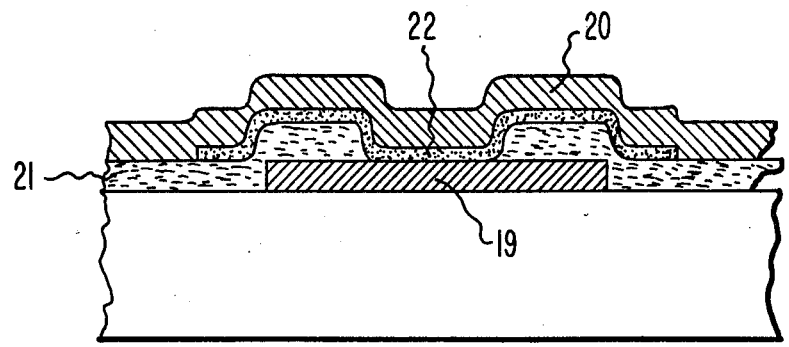
FIG. 8 shows a cross section of FIG. 5 through a cross-over between a pad line and a net line.

FIG. 8 shows a cross section through a cross-over between a pad line and a net line. Lower level metal 19 is generally separated from upper level metal 20 by the insulator 21 except for the via hole within the insulation where the metals are interconnected if appropriate for design.

Figure 9:
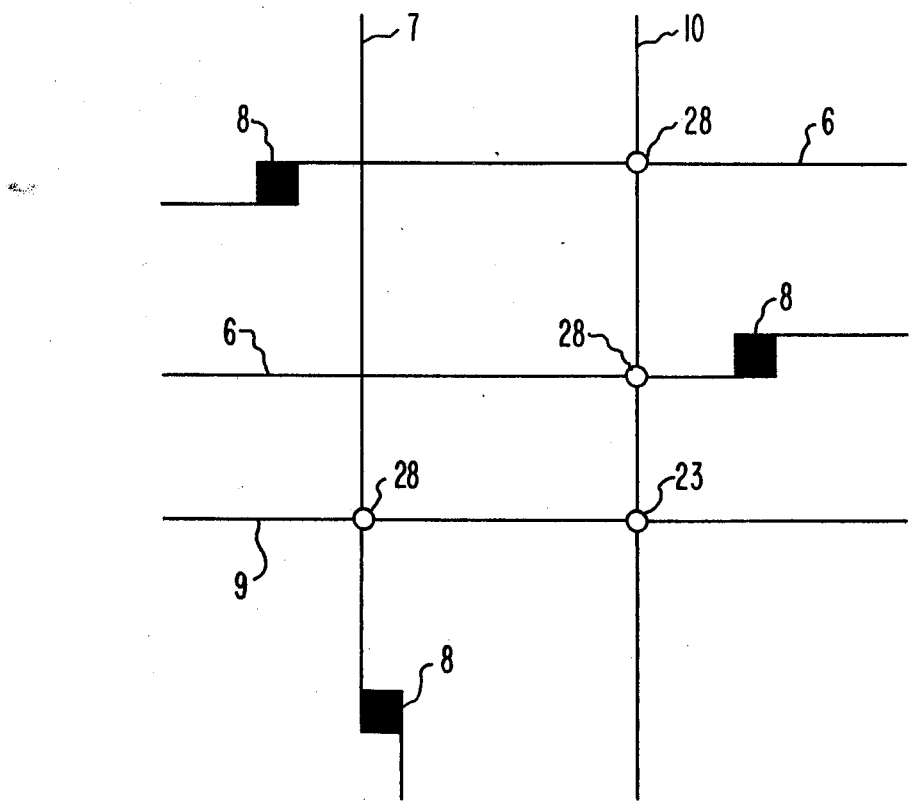
FIG. 9 is a diagramatic view of an interconnection between the pads.

FIG. 9 shows how the desired interconnection between three pads 8 is made by selecting two orthogonal net lines 9 & 10 which are permanently connected to each other by via hole 23 between the applicable pad lines 6 & 7 and the chosen net.

Figure 10:
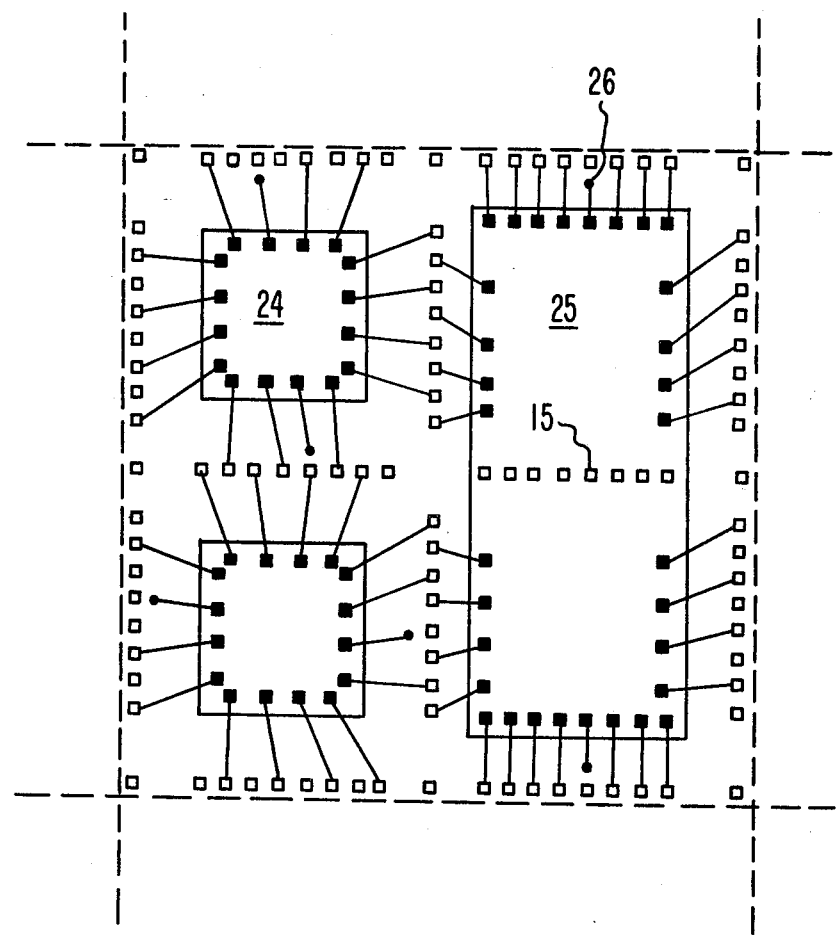
FIG. 10 is a diagram of a cell (2) of FIG. 1C showing how smaller chips can be bonded in the cell position.

FIG. 10 shows how smaller chips 24 & 25 which require less area and a smaller number of pads then provided by a cell can be accommodated efficiently. Some unused pads 15 are buried under the chip. Power connections 26 are made directly to one of the power rails and not to a pad 8.

Figure 11:
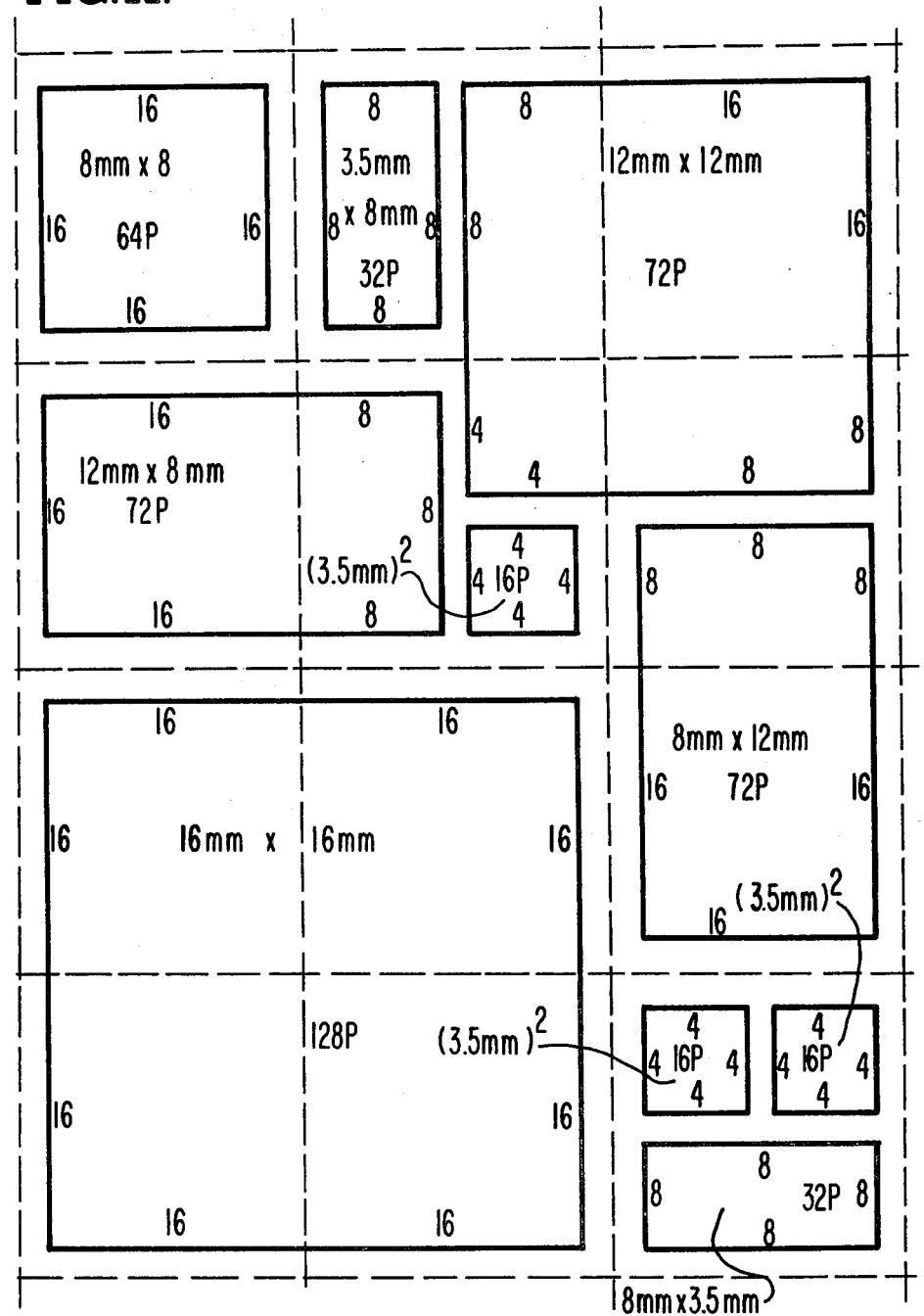
FIG. 11 is another diagram showing how to mix chips.

FIG. 11 shows how a mixture of chips which require larger, equal, and smaller areas than provided by a cell can be accommodated. The numbers within the chip symbols indicate maximum size and available logic signal pads.

Figure 12:
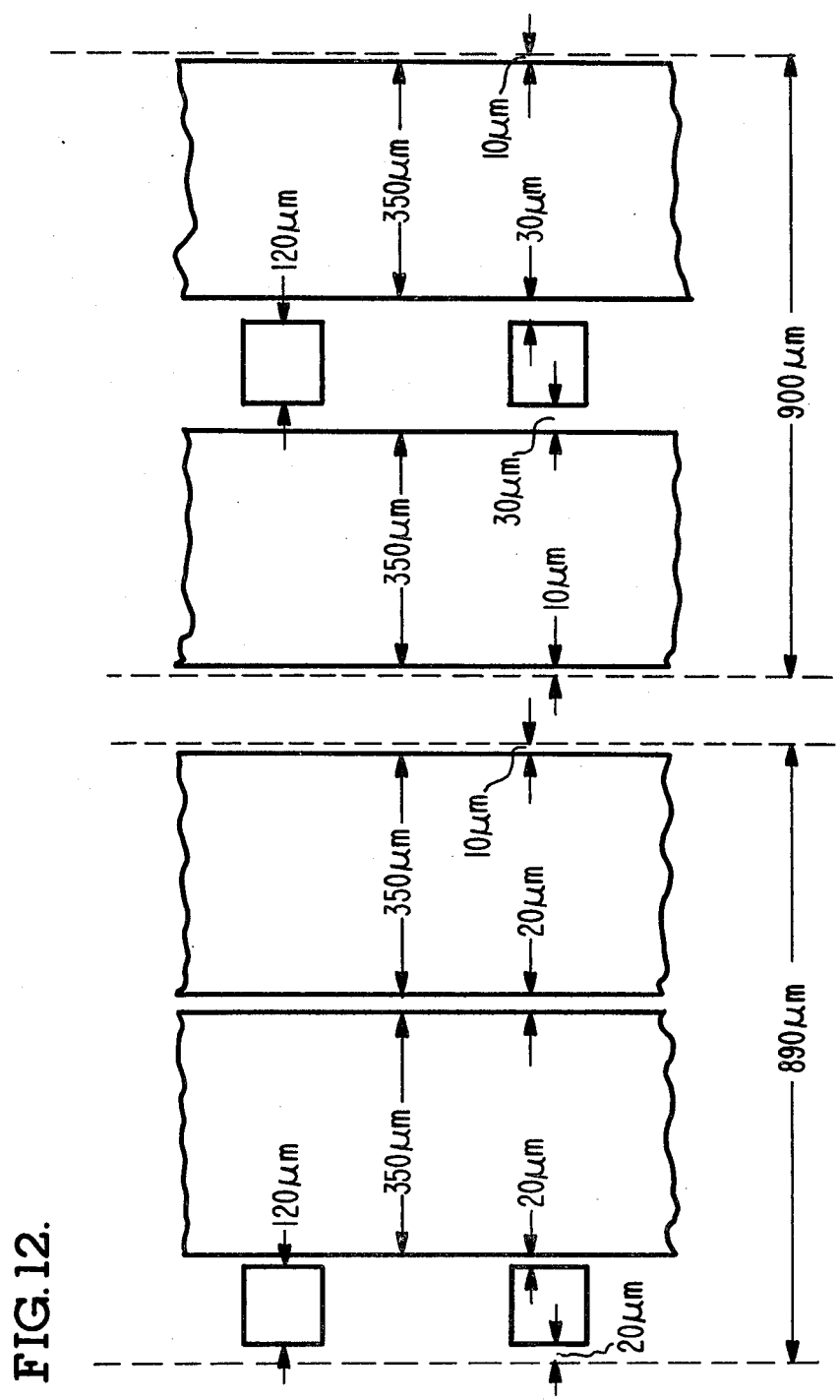
FIG. 12 shows a strip layout.

FIG. 12 shows how the strips containing the power buses and the bonding pads are layed out.

From the above, it will be seen that the drawings disclose a substrate 1 which by itself may be made either of conductive or non-conductive material. This substrate carries two planes or layers of patterned metal 19, 20, thus providing two principal levels of interconnection. An insulation layer 21 is placed between the metal layers and also between the lower metal layer and the substrate if the latter is conductive. Connections between the metal layers or between the metal layer and the substrate can be made through via holes in the insulator layer or layers, respectively.

The real estate provided by the substrate 1 in divided up into special areas used for inner cells 2 outer cells 3 signal hookup areas 4 and power hookup areas 5. In one preferred embodiment, the substrate may be a disk with a diameter of 75 mm, the cells may be squares with edges of 9 mm, the signal hookup areas may be rectangles with sides of 4.5 mm and 36 mm, and the power hookup areas may fill out the remaining space at the "corners".

The cells are intended to host the integrated circuit chips 24, 25 and to provide the bonding pads 8 for the signal connections between the chips and the substrate. In the preferred embodiment, the inner cells provide sixty-four signal pads each so that LSI chips with up to sixty-four leads and with a physical size of up to 8 mm by 8 mm can be accommodated. Chips which are substantially smaller than the possible maximum in terms of physical size and signal leads can share a cell as shown by example in FIG. 10. Since bond wires cannot jump over a neighbor chip to find a substrate bonding pad, auxiliary pads 15 are provided which are connected with the main pads 14 through the substrate (FIG. 6). Over-size chips which are either larger than 8 mm by 8 mm or which require more than sixty-four bonding pads can be stretched over 2 or more cells or any quadrants thereof. FIG. 11 shows some examples. The maximum chip size and number of available bonding pads is inscribed within the outline of a chip. It is also possible that bonding pads can be borrowed from another cell or quarter cell along the common edge between 2 cells. Since some pads will be bured under the chips, the back of the chips is insulated from these pads by suitable means as, for instance, chip bonding with non-conductive epoxy. All in all, it can be seen that the substrate can be universally used for any combination of chip sizes.

Some chips, particularly dynamic MOS RAM chips, have the unique characteristic that their aspect ratio is approximately 2:1 and that the chip bonding pads are located along the 2 smaller sides of the chip. Such chips can be accommodated more economically by reduced cells which provide bonding only in one direction. Such cells are shown in the preferred embodiment as outer cells. They are derived from complete cells by omitting either the horizontal or the vertical rows of bonding pads. RAM chips would be placed into an outer cell-like chip 25 shown in FIG. 10 except that all vertical pad columns on the chip as well as on the substrate would have been eliminated.

Power supply connections have been separated from logic signal connections because they must provide lower series resistance. Since it is not known in advance where the power inputs of a particular chip may be located, it is not possible to assign power pads on the substrate. This problem has been solved by providing 2 power buses 11 along the edges and along the center lines of all cells. A chip power pad which may be located anywhere along the edge of the chip can now be connected to a power bus instead of a substrate pad with a bond 26.

The power buses form a power grid over the entire substrate as shown in FIG. 4. The width of a power bus may be 360 μm. If implemented with 1 μm-thick aluminum, which yields a sheet resistivity of 30 mΩ/□, the longitudinal resistance would amount to 86 mΩ/mm. If the actual loads are known, the voltage drops in the power system can be computed accordingly. For a general approximation, one can work with a "power sheet" instead of a "power grid", whereby the equivalent power sheet resistivity δ is derived from the actual sheet resistivity δ by multiplying it with the ratio between cell width and bus width.

$$\rho = \frac{\text{cell width}}{\text{bus width}} \rho_0 = \frac{9 \text{ mm}}{3 * 0.35 \text{ mm}} * 30 \text{ m}\Omega/\square = 257 \text{ m}\Omega/\square$$

If a disk with the radius R is loaded over its entire surface with a current density j, and if the periphery of the disk is held at ground potential, then the point with the highest potential is found at the center of the disk and the voltage U between the center and the periphery is found to be $$U = \frac{\rho j R^2}{4}$$

δ=0.257Ω, 2R=75 mm, and j=Io/(9 mm)² yields U=1.12Ω*Io. Thus, for a load of 1 amp per cell, the voltage drop from the power hookup to the center of the wafer would be approximately 1 volt.

One has now to consider two basic types of circuits: "symmetrical circuits" as, for instance, CMOS and "unsymmetrical circuits" as, for instance, NMOS. For symmetrical circuits, which have a threshold centered between the power rails, the power grid as described so far is adequate. The supply voltages at the substrate edge may be 0 and +5 volts. The threshold would then be set by a chip-internal voltage divider to approximately 2.5 volts. A chip at the center would see voltage drops of approximately 1 volt at each power rail, i.e., the power input voltages would be +1 and +4 volts. The threshold of the circuit at the center would again be halfway between the power rails, i.e., at +2.5 volts so that all circuits on the wafer could properly communicate with each other.

In unsymmetrical circuits, all thresholds are referenced to one of the power rails (usually ground) and more or less independant from the other power rail. In this case, the voltage drop along the reference rail must be relatively small. This can be accomplished by using a solid ground sheet under the two metal layers discussed above and by making via connections between the ground grid and this sheet at several points per cell. If the ground sheet is comprised of a conductive silicon wafer with an additional layer of 2 μm-thick aluminum a sheet resistivity of 10 mΩ/□ may be accomplished. Based on the same formula used above, the maximum voltage drop can be estimated to be U=0.04Ω *Io or approximately 0.04 volts for cell currents of 1 amp each. This value is acceptable for most circuits.

The next problem to be solved by this invention is to interconnect all substrate pads with each other in any possibly desired way and also to connect any or all pads to the outside world. This is accomplished by a set of pad lines 6, 7 and a set of net lines 9, 10. A pad line is permanently connected to exactly one pad 8. Thus, there are as many pad lines on the substrate as there are pads, whose number is 16*64+16*32=1,536 in the preferred embodiment. A pad line is routed either horizontally or vertically across the substrate for a certain distance. As can be seen in FIG. 2, the principal wiring pattern is such that, if a horizontal set of pad lines serves n columns of pads, there must be (n−1) pad lines passing between two pads of one and the same column.

Net lines are also routed either horizontally or vertically across the substrate. One horizontal net line 9 and one vertical net line 10 are permanently connected to each other, thus forming a net. Each net is connected to one contact pad 27 in one of the hookup areas 4. One preferred embodiment of the invention provides a total of 288 nets. Since the hookup areas are 36 mm long, the resulting contact pitch is 0.5 mm. Another preferred embodiment provides 432 nets, causing a 0.33 mm pitch for the peripheral contacts 27.

The combined routing pattern of pad lines and net lines is such that each pad line crosses each net exactly one time, which can be seen by combining FIG. 2 and FIG. 3. A number of pads can now be connected to each other by choosing a net and by making connections at the cross-over points between this net and the respective pad lines (FIG. 9).

If one assumes that no more than 1,300 of the 1,536 available pads are actually used, the number of 288 nets would be adequate if the average fan-out is larger than 1,300/288−1=3.5. Accordingly, 432 nets would be adequate for an average fan-out of at least 2. Once an adequate number of nets have been chosen, one can truly say that all thinkable pad interconnection patterns can be derived from one standard set of lines.

In the preferred embodiment, the length of a pad line is 33 mm, and the length of a net line is approximately 42 mm (from one end to the farthest possible via). If the sheet resistivity of the metal is 30 mΩ/□, the longitudinal resistivity of a 10 μm wide pad line would be 3Ω/mm and that of a 20 μm wide net line would be 1.5Ω/mm.

The total resistance of a pad line amounts then to 100Ω and that of a net line to 63Ω. The longest possible interconnection from, say, a pad in the upper left corner to a net line at the far right, then down to the net line at the bottom, then to the far left side, and finally up along another pad line to another pad in the upper left corner would amount to 326Ω, a large value for a line between two pads which are located close to each other. An average connection would, of course, be much better. The best connection, however, is realized by choosing a net whose junction between its horizontal and vertical net lines is as close as possible to the pads which have to be tied together. It is, therefore, part of this invention to arrange the junctions 23 between the net lines not on a simple diagonal line as indicated for the small representative number of lines in FIG. 3, but rather in such a way that they are evenly distributed over the total field of inner cells. This provides a high probability that a net with a close-by junction can be found in all cases. The average connection length should thereby be reduced to about 1/5 of the maximum or to approximately 70Ω.

The actual programming or firing of a cross-over between a pad line and a net line can be done by a normal via hole. The method could be called "mask progamming" as the term is applied in prior art to ROM chips. The disadvantage of this method is that a new via hole mask must be prepared for each new interconnection pattern and that, therefore, a large number of different part numbers must be handled in the manufacturing process. The advantage is that, in case of large volumes per part numbers, the simple via reduces manufacturing costs over other methods and that the direct via does not introduce substantial series resistance.

Pads 18 used in another context are shown in FIG. 7 and FIG. 8 only in those locations where they are needed for a programming function. For the convenience of processing and other considerations, however, the pad area can be extended. Particularly, all pads in a vertical column can be made as contiguous strips, running in parallel under the upper level metal lines.

A net line can be tied to more than one pad line, but a pad line can only be tied to one net line.

Pads, pad lines, net lines, and power buses share the available space in the two metal layers as shown in FIG. 5. All pads 14, 15 are placed in the upper layer so that bonds can be made. The lower level space under the pads is not used because bonding may cause tiny cracks in the insulator which could lead to shorts with the lower layer metal. The power buses 11 are also part of the upper layer so that bonds can be made to it. An exception is the cross-over between two buses. Here, one bus dives through under the other bus. Net lines 9, 10 do not need to come to the surface except for the contact pads 27 in the contact areas 4. Horizontal net lines 9 may be placed into the lower layer as indicated in FIG. 7. They dive through under the power grids and avoid the bonding pads. Vertical net lines 10 may be placed in the upper layer. At the edge of the open fields between the power grids they have to dive to the lower layer so that they can also pass the grids. Note that the required lower level space is available because no other horizontal lines run under the power grids. Horizontal pad lines 6 run in the lower level just as the horizontal net lines 9 except that a via connection must be made to the bonding pads 14, 15. Note that the pad lines do not run under the bonding pads but rather in the space between them though lines and pads are in different layers. This is accomplished by fitting the pads between the lines as sketched in FIG. 2. The auxiliary pads 15 which have not been shown in FIG. 2 can be connected the same way because they are topologically adjacent to their respective main pads 14. The vertical pad lines 7 are placed together with their pads into the upper layer but must dive together with the vertical net lines in order to pass the horizontal power buses. The auxiliary pads 15 are connected to their respective pad lines through vias.

Outer cells have the same power grids but only one-half of the net and pad lines is shown in FIG. 2 and 3. Their wiring pattern is a direct subset of that used for inner cells.

The space of a 9 mm cell may be allocated to the major areas as shown in FIG. 5: 0.89 mm each for the edge strips containing main bonding and two power buses, 0.9 mm for the center strip containing auxiliary pads and two power buses, and 3.16 mm each for the fields which contain each 8 pad line strips and 9 net line strips. The edge and center strips may be divided down further as shown in FIG. 12. A net line strip which is 120 $\mu$m wide can be used either for four 20 $\mu$m-lines and four 10 $\mu$m-spaces or for six 10 $\mu$m-lines and six 10$\mu$/m-spaces. A pad line strip which is 260 $\mu$m wide can be used for one 120 $\mu$m pad, seven 10 $\mu$m-lines, and seven 10 $\mu$m spaces.

While I have discussed hybrid circuits in detail, the pattern discussed using auxiliary lead lines to test the network may be used when chips are formed on the wafer. It is possible using known techniques, as by electron beam pattern generation, to techniques, as by electron beam pattern generation, to make both the dice and the networks on the same wafer. Here testing of the dice is tested by die to die progression in accordance with U.S. Pat. No. 4,183,460 of Jan. 15, 1980. Preferably, before proceeding to the next die, the tester for the die 21' is programmed to switch to the network test mode and the individual probe at point 51' is used as a control while the pad 16' is used as ground through the elastomeric gasket 17'.

What is claimed is:

1. A wafer scale integrated circuit which incorporates integrated circuit die of different sizes; comprising:
   a semiconductor wafer having a major surface;
   patterned metal layers over said surface which define an array of uniformly sized cells for receiving and interconnecting said die;
   said cells having main bonding pads around their edges, auxiliary bonding pads in their interior, and conductors which connect each auxiliary bonding pad to a respective main bonding pad to form auxiliary-main bonding pad pairs;
   a plurality of said different-sized die arranged over said cells such that several large die occupy respective spaced apart areas on said surface, the spaces between said large die being smaller than the large die themselves and being at least partially filled with small die to thereby minimize any empty space between the die due to their different sizes; and
   selected subsets of the main and auxiliary bonding pads being aligned with the die's edges and connected to terminals on the die such that no two pads of the same pair are included in said subset.

2. A wafer scale integrated circuit according to claim 1 wherein two different-sized die overlie respective portions of a single cell, and respective subsets of that cell's main and auxiliary bonding pads align with the edges and connect to terminals on said two different-sized die.

3. A wafer scale integrated circuit according to claim 1 wherein one of said different-sized die overlies a first cell plus a portion of an adjacent second cell, and a subset of the first cell's main bonding pads plus a subset of the second cell's main and auxiliary bonding pads align with the edges and connect to terminals on said one die.

4. A wafer scale integrated circuit according to claim 1 wherein one of said different-sized die overlies a first cell plus respective portions of adjacent second, third, and fourth cells; and a subset of the first cell's main bonding pads plus a subset of the second and third cell's main and auxiliary bonding pads plus a subset of the fourth cell's auxiliary bonding pads align with and connect to terminals on said one die.

5. A wafer scale integrated circuit according to claim 1 wherein one of said different-sized die overlies a first cell plus adjacent second, third, and fourth cells in their entirety; and respective subsets of the main bonding pads of the first, second, third, and fourth cells align with and connect to terminals on said one die.

6. A wafer scale integrated circuit according to claim 1 wherein said auxiliary bonding pads of a cell are arranged as an "X" the legs of which divide the cell into quarters.

7. A wafer scale integrated circuit according to claim 1 wherein said patterned metal layers include upper and lower metal layers that are separated by an insulating layer, said main and auxiliary bonding pads are a part of said patterned upper metal layer, and said patterned lower metal layer forms conductors which run from cell to cell by passing between but not under any of said bonding pads.

8. A wafer scale integrated circuit according to claim 1 wherein said cells further include power conductors that extend around the cell's edges parallel to the cell's main bonding pads, and said die have respective power terminals at different locations that connect to said power conductors at their respective locations.

9. A wafer scale integrated circuit according to claim 1 wherein said different-sized die are arranged face up over said cells and are connected to said bonding paids by discrete wires.

10. A wafer scale integrated circuit according to claim 1 wherein said semiconductor wafer is a silicon wafer.

11. A wafer scale integrated circuit which incorporates integrated circuit die of different sizes; comprising:
    a substrate having a major surface;
    patterned metal layers on said surface which define an array of uniformly sized cells for receiving and interconnecting said die;
    said cells having main bonding pads around their edges, auxiliary bonding pads in their interior, and conductors which connect each auxiliary bonding pad to a respective main bonding pad; and
    a plurality of die of different size, which overlie respective portions of a single cell, and which have terminals that are connected to respective subsets of that cell's main bonding pads and auxiliary bonding pads while other subsets of that single cell's bonding pads underlie and are not connected to said die.

12. A wafer scale integrated circuit according to claim 11 wherein a first sized die occupies a quarter of said single cell and does not extend beyond it; a second sized die also occupies a quarter of said single cell and does extend beyond it, and a third sized die occupies a half of said single cell and also extends beyond it.

13. A wafer scale integrated circuit according to claim 11 wherein a first sized die occupies a half of said single cell and extends beyond it, and a second sized die also occupies a half of said single cell and extends beyond it.

14. A wafer scale integrated circuit according to claim 11 wherein first and second die of the same size occupy respective quarters of said single cell and do not extend beyond it, and a third die occupies a half of said single cell and does not extend beyond it.

15. A wafer scale integrated circuit which incorporates integrated circuit die of different sizes; comprising:
   a semiconductor wafer having a major surface;
   patterned metal layers over said surface which define an array of bonding pads for receiving and interconnecting said die;
   a plurality of said different-sized die arranged over said bonding pads such that several large die occupy respective spaced apart areas on said surface, the spaces between said large die being smaller than the large die themselves and being at least partially filled with small die to thereby minimize any empty space between the die due to their different sizes; and
   a subset of said bonding pads being aligned with the die edges and connected to terminals on the die.

* * * * *